(12) United States Patent
Zhang

(10) Patent No.: US 9,997,577 B2
(45) Date of Patent: Jun. 12, 2018

(54) ORGANIC LIGHT EMITTING DIODE DISPLAY DEVICE HAVING ELECTRON TRANSPORT LAYER LATERALLY SPACED FROM HOLE TRANSPORT LAYER AND METHOD FOR MANUFACTURING THE SAME

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Jinzhong Zhang, Beijing (CN)

(73) Assignees: BOE TECHNOLOGY GROUP CO., LTD, Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 0 days. days.

(21) Appl. No.: 14/769,080

(22) PCT Filed: Dec. 2, 2014

(86) PCT No.: PCT/CN2014/092767
§ 371 (c)(1),
(2) Date: Aug. 19, 2015

(87) PCT Pub. No.: WO2016/033884
PCT Pub. Date: Mar. 10, 2016

(65) Prior Publication Data
US 2016/0254322 A1 Sep. 1, 2016

(30) Foreign Application Priority Data
Sep. 5, 2014 (CN) .......................... 2014 1 0453471

(51) Int. Cl.
*H01L 27/32* (2006.01)
*H01L 51/50* (2006.01)
(Continued)

(52) U.S. Cl.
CPC ........ *H01L 27/326* (2013.01); *H01L 27/3262* (2013.01); *H01L 51/508* (2013.01);
(Continued)

(58) Field of Classification Search
CPC ............... H01L 27/326; H01L 27/3262; H01L 51/5072; H01L 51/508; H01L 51/5056; H01L 51/5064; H01L 51/5096
See application file for complete search history.

(56) References Cited

U.S. PATENT DOCUMENTS 6,091,196 A 7/2000 Codama
2006/0237731 A1* 10/2006 Furukawa ........... H01L 51/5296
257/83
(Continued)

FOREIGN PATENT DOCUMENTS

CN 101855742 10/2010
CN 102629667 8/2012
(Continued)

OTHER PUBLICATIONS

Definition of projection. (n.d.) Collins English Dictionary—Complete and Unabridged, 12th Edition 2014. (1991, 1994, 1998, 2000, 2003, 2006, 2007, 2009, 2011, 2014). Retrieved Mar. 4, 2017 from http://www.thefreedictionary.com/projection.*
(Continued)

*Primary Examiner* — Michael Jung
(74) *Attorney, Agent, or Firm* — Womble Bond Dickinson (US) LLP

(57) ABSTRACT

The embodiments of the present invention provide an organic light emitting diode display device and a method for
(Continued)

manufacturing the same. The organic light emitting diode display device comprises: an array substrate comprising a plurality of pixel opening areas; a light emitting device located in each of the pixel opening areas on the array substrate; wherein the light emitting device comprises: a hole transport layer, a luminescent layer and an electron transport layer; wherein a vertical projection of the luminescent layer on the array substrate defines the pixel opening area; the hole transport layer and the electron transport layer are located on different sides of the luminescent layer respectively, or the hole transport layer and the electron transport layer are located on the same side of the luminescent layer; both a vertical projection of the hole transport layer on the array substrate and a vertical projection of the electron transport layer on the array substrate partially cover the pixel opening area; the vertical projection of the hole transport layer on the array substrate and the vertical projection of the electron transport layer on the array substrate do not overlap with each other. The display device and the method for manufacturing the same can reduce the number of the layers required for transmitting the light out of the light emitting device, reducing the loss of the light due to the absorption and scattering of the films; improving the external quantum efficiency of the light emitting device; thereby improving the light emitting efficiency of the display device.

8 Claims, 3 Drawing Sheets

(51) Int. Cl.
 *H01L 51/56* (2006.01)
 *H01L 51/52* (2006.01)
(52) U.S. Cl.
 CPC ...... *H01L 51/5012* (2013.01); *H01L 51/5056* (2013.01); *H01L 51/5064* (2013.01); *H01L 51/5072* (2013.01); *H01L 51/5096* (2013.01); *H01L 51/5253* (2013.01); *H01L 51/56* (2013.01); *H01L 2227/323* (2013.01)

(56) References Cited

U.S. PATENT DOCUMENTS

| | | | |
|---|---|---|---|
| 2009/0008628 A1* | 1/2009 | Choi | B82Y 20/00 257/13 |
| 2010/0090202 A1 | 4/2010 | Obata et al. | |
| 2011/0175067 A1 | 7/2011 | Sugi et al. | |
| 2011/0315963 A1* | 12/2011 | Yoshinaga | C09K 11/06 257/40 |
| 2014/0191200 A1 | 7/2014 | Hamer et al. | |
| 2014/0231766 A1 | 8/2014 | Kim et al. | |
| 2014/0312337 A1* | 10/2014 | Isobe | H01L 51/5231 257/40 |
| 2016/0358980 A1* | 12/2016 | Inoue | H05B 33/145 |

FOREIGN PATENT DOCUMENTS

| | | |
|---|---|---|
| CN | 202772197 U | 3/2013 |
| EP | 1718123 A1 | 11/2006 |

OTHER PUBLICATIONS

International Search Report and Written Opinion with English Language Translation, dated May 13, 2015, Application No. PCT/CN2014/092767.
Office Action in Chinese Application No. 201410453471.8 dated Jul. 15, 2016, with English translation. 9 pages.
Office Action in Korean Application No. 10-2015-7022657 dated Aug. 22, 2016, with English translation. 5 pages.
Office Action in Chinese Application No. 201410453471.8 dated Dec. 7, 2016, with English translation. 4 pages.
European Search Report and Written Opinion received for EP Patent Application No. 14882173.9, dated Apr. 5, 2018, 6 pages.

* cited by examiner

- - Prior Art - -

ORGANIC LIGHT EMITTING DIODE DISPLAY DEVICE HAVING ELECTRON TRANSPORT LAYER LATERALLY SPACED FROM HOLE TRANSPORT LAYER AND METHOD FOR MANUFACTURING THE SAME

FIELD OF THE INVENTION

The present invention relates to the technical field of display, in particular to an organic light emitting diode (OLED) display device and a method for manufacturing the same.

BACKGROUND OF THE INVENTION

With the continuous development of display technology, OLED display device has become the main trend of the next generation display device due to the advantages of light weight, high contrast, high color gamut, low power consumption, and realizability of flexible display.

Among the OLED display devices, active matrix organic light emitting diode (AMOLED) display has a quick response, and can meet the requirements of display devices with various sizes, so it has attracted attention of many enterprises. AMOLED display device typically comprises an array substrate and light emitting devices, wherein the light emitting devices are mainly realized by a fine metal mask, of which the implementation has become increasingly mature, enabling the mass production of AMOLED.

In the process of realizing the AMOLED, the light emitting device is formed by depositing OLED materials on a low temperature polysilicon back plate with a predetermined sequence by the method for evaporation, and performing a composition process with the pattern on the fine metal mask. As shown in FIG. 1, the structure of an AMOLED display device generally comprises: an array substrate 101, an anode 102, a hole injection layer 103, a hole transport layer 104, a luminescent layer 105, an electron transport layer 106, an electron injection layer 107 and a cathode 108.

Taking the above light emitting device being a top emitting type as an example, during the operation, the light emitted by the luminescent layer will be emitted upwards and downwards respectively; the light emitted upwards is transmitted out through the electron transport layer, the electron injection layer and the cathode; the light emitted downwards is transmitted to the anode through the hole transport layer, the hole injection layer, then reflected upwards by the anode; the reflected light is transmitted out through the hole injection layer, the hole transport layer, the luminescent layer, the electron transport layer, the electron injection layer and the cathode. During the whole luminescent process, when the light is transmitted in the above mentioned layers, it is partially absorbed and scattered due to the optical waveguide effect; the light should be transmitted out of the light emitting device through many layers, therefore the loss of the light emitted from the light emitting device is relatively large, and the external quantum efficiency of the light emitting device is low, which leads to a low light emitting efficiency of AMOLED.

SUMMARY OF THE INVENTION

The embodiments of the present invention provide an OLED display device and a method for manufacturing the same, to improve the external quantum efficiency of the light emitting device, thereby improving the light emitting efficiency of the OLED display device.

To this end, the present invention applies the following solutions:

An organic light emitting diode display device; wherein the organic light emitting diode display device comprises:

an array substrate comprising a plurality of pixel opening areas;

a light emitting device located in each of the pixel opening areas on the array substrate; wherein the light emitting device comprises: a hole transport layer, a luminescent layer and an electron transport layer; wherein a vertical projection of the luminescent layer on the array substrate defines the pixel opening area;

the hole transport layer and the electron transport layer are located on different sides of the luminescent layer respectively, or the hole transport layer and the electron transport layer are located on the same side of the luminescent layer;

both a vertical projection of the hole transport layer on the array substrate and a vertical projection of the electron transport layer on the array substrate partially cover the pixel opening area; the vertical projection of the hole transport layer on the array substrate and the vertical projection of the electron transport layer on the array substrate do not overlap with each other.

Preferably, the light emitting device further comprises: a hole injection layer located on a side of the hole transport layer departing from the luminescent layer, and an electron injection layer located on a side of the electron transport layer departing from the luminescent layer; the hole injection layer completely overlaps with the hole transport layer; the electron injection layer completely overlaps with the electron transport layer.

Preferably, the light emitting device further comprises: an anode located on a side of the hole injection layer departing from the luminescent layer, and a cathode located on a side of the electron injection layer departing from the luminescent layer.

Preferably, if the hole transport layer and the electron transport layer are located on the same side of the luminescent layer, the anode completely overlaps with the hole transport layer; the cathode completely overlaps with the electron transport layer.

Preferably, if the hole transport layer is located on a side of the luminescent layer facing the array substrate, and the electron transport layer is located on a side of the luminescent layer departing away the array substrate, the anode completely overlaps with the luminescent layer or the hole injection layer, the cathode completely overlaps with the electron injection layer.

Preferably, if the hole transport layer is located on a side of the luminescent layer departing away the array substrate, and the electron transport layer is located on a side of the luminescent layer facing the array substrate, the anode completely overlaps with the hole injection layer, the cathode completely overlaps with the electron injection layer or the luminescent layer.

Preferably, the light emitting device further comprises: an electron blocking layer located between the hole transport layer and the luminescent layer, and a hole blocking layer located between the electron transport layer and the luminescent layer.

Preferably, the organic light emitting diode display device further comprises: a protection layer covering the light emitting device.

The present invention further provides a method for manufacturing an organic light emitting diode display device; the method comprises: forming an array substrate comprising a plurality of pixel opening areas, forming a light emitting device in each of the pixel opening areas on the array substrate, wherein forming a light emitting device comprises forming a hole transport layer, a luminescent layer and a electron transport layer; wherein a vertical projection of the luminescent layer on the array substrate defines the pixel opening area; the hole transport layer and the electron transport layer are located on different sides of the luminescent layer respectively, or the hole transport layer and the electron transport layer are located on the same side of the luminescent layer; both a vertical projection of the hole transport layer on the array substrate and a vertical projection of the electron transport layer on the array substrate partially cover the pixel opening area; the vertical projection of the hole transport layer on the array substrate and the vertical projection of the electron transport layer on the array substrate do not overlap with each other.

Preferably, the hole transport layer, the luminescent layer and the electron transport layer are formed on the array substrate with evaporation by applying a fine metal mask.

In the OLED display device and the method for manufacturing the same, a vertical projection of the luminescent layer of the luminescent layer on the array substrate defines the pixel opening area, both a vertical projection of the hole transport layer on the array substrate and a vertical projection of the electron transport layer on the array substrate partially cover the pixel opening area; the vertical projection of the hole transport layer on the array substrate and the vertical projection of the electron transport layer on the array substrate do not overlap with each other. In the emitting direction, the number of the layers in each area of the light emitting device is reduced, then the absorption and scattering effect of the films for the light is reduced, improving the external quantum efficiency of the light emitting device; thereby improving the light emitting efficiency of the OLED display device.

BRIEF DESCRIPTION OF THE DRAWINGS

In order to more clearly illustrate the technical solutions in embodiments of the invention or in the prior art, the appended drawings needed to be used in the description of the embodiments or the prior art will be introduced briefly in the following. Obviously, the drawings in the following description are only some embodiments of the invention, and for those of ordinary skills in the art, other drawings may be obtained according to these drawings under the premise of not paying out creative work.

DETAILED DESCRIPTION OF THE INVENTION

In the following, the technical solutions in embodiments of the invention will be described clearly and completely in connection with the drawings in the embodiments of the invention. Obviously, the described embodiments are only part of the embodiments of the invention, and not all of the embodiments. Based on the embodiments in the invention, all other embodiments obtained by those of ordinary skills in the art under the premise of not paying out creative work pertain to the protection scope of the invention.

Embodiment 1

Figure 1:
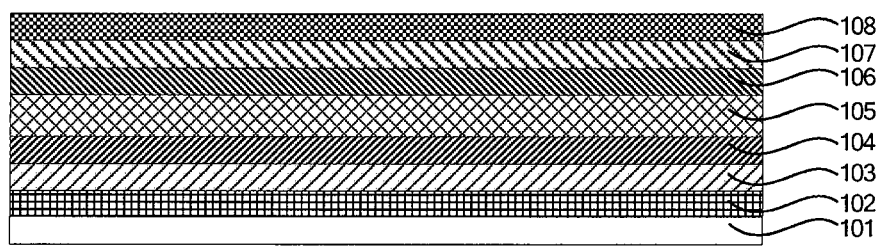
FIG. 1 is a structural diagram of an OLED in the prior art.
Figure 2:
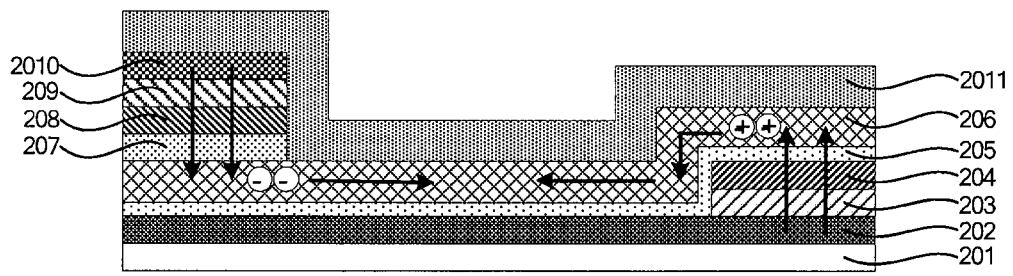
FIG. 2a is a schematic diagram of an OLED device provided by an embodiment of the present invention.
FIG. 2b is a structural diagram of a light emitting device of an OLED device provided by a second embodiment of the present invention.

An embodiment of the present invention provides an OLED display device; as shown in FIG. 2a, the organic light emitting diode display device comprises:

an array substrate 201 comprising a plurality of pixel opening areas 200;

a light emitting device located in each of the pixel opening areas on the array substrate; wherein the light emitting device comprises: a hole transport layer, a luminescent layer and an electron transport layer; wherein a vertical projection of the luminescent layer on the array substrate defines the pixel opening area;

the hole transport layer and the electron transport layer are located on different sides of the luminescent layer respectively, or the hole transport layer and the electron transport layer are located on the same side of the luminescent layer;

both a vertical projection of the hole transport layer on the array substrate and a vertical projection of the electron transport layer on the array substrate partially cover the pixel opening area; the vertical projection of the hole transport layer on the array substrate and the vertical projection of the electron transport layer on the array substrate do not overlap with each other.

In the context of the present invention, the "pixel opening area" refers to a plane area defined by a vertical projection of the luminescent layer on the array substrate, which plane area is parallel to the array substrate. In the embodiments of the present invention, the "pixel opening area" can also be simplified as a part of area of the array substrate covered by the vertical projection of the luminescent layer on the array substrate.

Accordingly, an embodiment of the present invention further provides a method for manufacturing an organic light emitting diode display device according to the embodiment of the present invention; the method comprises:

forming an array substrate comprising a plurality of pixel opening areas, forming a light emitting device in each of the pixel opening areas on the array substrate, wherein forming a light emitting device comprises forming a hole transport layer, a luminescent layer and a electron transport layer; wherein a vertical projection of the luminescent layer on the array substrate defines the pixel opening area;

the hole transport layer and the electron transport layer are located on different sides of the luminescent layer respectively, or the hole transport layer and the electron transport layer are located on the same side of the luminescent layer;

both a vertical projection of the hole transport layer on the array substrate and a vertical projection of the electron transport layer on the array substrate partially cover the pixel opening area; the vertical projection of the hole transport layer on the array substrate and the vertical projection of the electron transport layer on the array substrate do not overlap with each other.

In the OLED display device and the method for manufacturing the same, a vertical projection of the luminescent layer of the luminescent layer on the array substrate defines the pixel opening area, both a vertical projection of the hole transport layer on the array substrate and a vertical projection of the electron transport layer on the array substrate partially cover the pixel opening area; the vertical projection of the hole transport layer on the array substrate and the vertical projection of the electron transport layer on the array substrate do not overlap with each other. In the emitting direction of the light emitting device, the number of the layers in each area of the light emitting device is reduced. A recombination occurs for the hole transported into the luminescent layer through the hole transport layer and the electron transported into the luminescent layer through the electron transport layer; for the light emitted out of the device, the number of the layers in the light path is reduced, then the absorption and scattering effect for the light is reduced, reducing the loss of the light in the transmitting process, improving the external quantum efficiency of the light emitting device; thereby improving the light emitting efficiency of the OLED display device.

Embodiment 2

Based on the OLED display device provided by the Embodiment 1, the OLED display device provided by the embodiment can also comprise: a hole injection layer located on a side of the hole transport layer departing from the luminescent layer, and an electron injection layer located on a side of the electron transport layer departing from the luminescent layer; the hole injection layer completely overlaps with the hole transport layer; the electron injection layer completely overlaps with the electron transport layer; an anode located on a side of the hole injection layer departing from the luminescent layer, and a cathode located on a side of the electron injection layer departing from the luminescent layer.

That is to say, the light emitting device can be divided into a luminescent layer for the recombination of hole and electron, a hole unit for transporting holes to the luminescent layer, and an electron unit for transporting electrons to the luminescent layer. The hole transport layer, the hole injection layer and the anode belong to the hole unit; the electron transport layer, the electron injection layer and the cathode belong to the electron unit. In the embodiments of the present invention, each layer of the hole unit is always located on the same side of the luminescent layer, and each layer of the electron unit is always located on the same side of the luminescent layer.

However, in the embodiments of the present invention, the positions of the hole unit and the electron unit with respect to the luminescent layer are not limited; for example, the hole unit and the electron unit can be located on the same side of the luminescent layer, or on different sides of the luminescent layer respectively.

In particular, as shown in FIG. 2b, the hole transport layer 204 of the light emitting device can be located on a side of the luminescent layer 206 facing the array substrate 201, and the electron transport layer 208 can be located on a side of the luminescent layer 206 departing from the array substrate 201; the anode 202 completely overlaps with the luminescent layer 206, the cathode 2010 completely overlaps with the electron injection layer 209. That is to say, the hole transport layer 204, the hole injection layer 203 and the anode 202 belonging to the hole unit are located on the lower side of the luminescent layer 206; the electron transport layer 208, the electron injection layer 209 and the cathode 2010 belonging to the electron unit are located on the upper side of the luminescent layer 206; moreover, a vertical projection of the anode 202 on the array substrate 201 covers the pixel opening area, a vertical projection of the cathode 2010 on the array substrate 201 partially covers the pixel opening area.

More particularly, the anode 202 completely covers each pixel opening area of the array substrate 201; the hole injection layer 203 is located on an end of the pixel opening area, and partially covers the anode 202, i.e., a vertical projection of the hole injection layer 203 on the array substrate 201 partially covers the luminescent layer 206; the hole transport layer 204 is located over the hole injection layer 203, and completely covers the hole injection layer 203; the luminescent layer 206 covers the hole transport layer 204 and a part of the anode 202 not covered by the hole injection layer 203; the electron transport layer 208 is located on another end of the pixel opening area, and partially covers the luminescent layer 206; moreover, the vertical projection of the electron transport layer 208 on the array substrate 201 and the vertical projection of the hole injection layer 203 on the array substrate 201 do not overlap with each other; the electron injection layer 209 is located over the electron transport layer 208, and completely overlaps with the electron transport layer 208; the cathode 2010 is located over the electron injection layer 209, and completely overlaps with the electron injection layer 209.

The working principle of the light emitting device is: as shown in FIG. 2b, the holes are injected from the anode 202; since the highest occupied molecular orbital (HOMO) level of the anode 202 is typically higher than the HOMO level of the luminescent layer 206, it is difficult to inject holes into the luminescent layer 206 directly. Therefore the holes will vertically enter the luminescent layer 206 through the hole injection layer 203 and the hole transport layer 204 stacked on an end of the pixel opening area; the electrons are injected from the cathode 2010, passing through the electron injection layer 209 and electron transport layer 208; since the electron injection layer 209 and electron transport layer 208 are only stacked on the end of the pixel opening area opposite to the position of the hole injection layer 203 and the hole transport layer 204, the electrons can vertically enter the luminescent layer 206 from an end opposite to the end where the holes enter the luminescent layer 206; the electrons and holes arrive at the luminescent layer 206 and move towards each other, and a recombination occurs, forming excitons. The excitons emit light during the process of returning from the excited state to the ground state. It can be seen that in the display device provided by the present invention, the hole unit and the electron unit are arranged on the different ends of the luminescent layer 206, such that the direction of the current flow is changed from the original vertical flow into: a vertical flow at first, and then a horizontal flow.

If the above OLED display device belongs to the top emitting type, in the process of transmitting the light emitted by the luminescent layer 206 out of the light emitting device along an emitting direction, in the intermediate area on which the vertical projection of the hole injection layer 203 on the array substrate 201 and the vertical projection of the electron injection layer 209 on the array substrate 201 do not overlap with each other, the light emitted upwards can be transmitted out without passing through the electron transport layer 208, the electron injection layer 209 or the cathode 2010; the light emitted downwards is transmitted to the anode 202, then is reflected by the anode 202; the reflected light can be transmitted out from the luminescent layer 206, without passing through the hole injection layer 203, the hole transport layer 204, the electron transport layer 208, the electron injection layer 209 or the cathode 2010. Therefore, the number of the layers corresponding to the luminescent layer 206 of the light emitting device is reduced, then the absorption and scattering effect of the films for the light is reduced, improving the external quantum efficiency of the light emitting device; thereby improving the light emitting efficiency of the OLED display device.

In addition, at the area of the end near the hole injection layer 203 of the light emitting device, the light emitted by the luminescent layer 206 can be transmitted out of the light emitting device without passing through the layers of the electron unit. Therefore, the numbers of the layers on both ends are reduced, and this is also helpful for improving the external quantum efficiency of the light emitting device.

As shown in FIG. 2b, preferably, the light emitting device of the OLED display device can further comprise: an electron blocking layer 205 located between the hole transport layer 204 and the luminescent layer 206, and a hole blocking layer 207 located between the electron transport layer 208 and the luminescent layer 206. The electron blocking layer 205 is used to blocking the electrons such that the electrons can not be transported from the luminescent layer 206 to the hole transport layer 206 and the anode 202; the hole blocking layer 207 is used for blocking the holes such that the holes can not be transported from the luminescent layer 206 to the electron transport layer 208; therefore, the injection of the electrons and the holes in the luminescent layer 206 is balanced, the recombination probability of the electrons and the holes is enhanced, improving the internal quantum efficiency of the light emitting device; thereby further improving the light emitting efficiency of the OLED display device.

It should be noted that the structures of the hole blocking layer and the electron blocking layer are different for light emitting devices with different structures. For example, as shown in FIG. 2b, if the hole unit is located on the lower side of the luminescent layer 206, the electron unit is located on the upper side of the luminescent layer 206, and the vertical projection of the anode 202 on the array substrate 201 completely covers the vertical projection of the luminescent layer 206 on the array substrate 201, the vertical projection of the electron blocking layer 205 on the array substrate 201 should completely cover the vertical projection of the luminescent layer 206 on the array substrate 201, such that the electrons will absolutely not enter the hole unit from the luminescent layer 206; the vertical projection of the hole blocking layer 207 on the array substrate 201 can only partially cover the vertical projection of the luminescent layer 206 on the array substrate 201 (in particular, the vertical projection of the hole blocking layer 207 on the array substrate 201 completely overlaps with the vertical projection of the electron transport layer 208 on the array substrate 201) such that the holes will absolutely not enter the electron unit from the luminescent layer 206. If the hole unit is located on the upper side of the luminescent layer, the electron unit is located on the lower side of the luminescent layer, and the vertical projection of the cathode on the array substrate completely covers the vertical projection of the luminescent layer on the array substrate, the vertical projection of the hole blocking layer on the array substrate should completely cover the vertical projection of the luminescent layer on the array substrate, such that the holes will absolutely not enter the electron unit from the luminescent layer; the vertical projection of the electron blocking layer on the array substrate can only partially cover the vertical projection of the luminescent layer on the array substrate (in particular, the vertical projection of the electron blocking layer on the array substrate completely overlaps with the vertical projection of the hole transport layer on the array substrate) such that the electrons will absolutely not enter the hole unit from the luminescent layer.

In addition, as shown in FIG. 2b, preferably, the OLED display device provided by an embodiment of the present invention can further comprise: a protection layer 2011 covering the light emitting device, to protect the light emitting device from being corroded or oxidized.

Corresponding to the OLED display device provided by the present embodiment, the present embodiment also provides a method for manufacturing the device. Preferably, the hole transport layer 204, the luminescent layer 206 and the electron transport layer 208 are formed on the array substrate 201 with evaporation by applying a fine metal mask.

Taking the OLED display device shown in FIG. 2b as an example, the method for manufacturing the device comprises:

Step S1: preparing the array substrate 201 as a control panel of the OLED display device.

In this step, preferably, the array substrate 201 is a low temperature polysilicon backboard; the prepared array substrate 201 preferably comprises: a buffer layer, a polysilicon layer, a gate layer, a gate insulating layer, an interlayer dielectric layer, and a source/drain electrode layer, which are formed in sequence. The array substrate 201 comprises a plurality of pixels (i.e., a plurality of pixel opening areas); the structure of each pixel can preferably comprise six thin film transistors and two storage capacitors (i.e., 6T2C structure), in other embodiments of the invention, a single pixel can apply other pixel structures, such as 2T1C, 5T1C, 7T2C, etc.

Step S2: forming the anode 202 of the light emitting device on the array substrate 201.

This step can particularly comprises: depositing an anode material on the array substrate 201, forming the anode 202 completely covering the pixel opening area of each pixel on the substrate 201.

If the light emitting device to be formed is a top emitting type device, the structure of the anode 202 can be a film formed by stacking an indium tin oxide layer, a silver layer and an indium tin oxide layer in sequence. The thickness of the silver layer is preferably 10 nm, and the thickness of the indium tin oxide layers on both sides of the silver layer is preferably 50 nm. Wherein the silver layer is used to reflect the light transmitted to the anode with a high efficiency.

For an OLED display device of bottom emitting type or side emitting type, the structure of the anode can be designed according to the different light emitting types. For example: for the OLED display device of bottom emitting type, the anode may not comprise a silver layer, at the same time, a reflection layer should be provided on the top of the light emitting device, such that the light transmitted upwards can be reflected towards the array substrate.

Step S3: forming the hole injection layer 203 on the anode 202.

This step can particularly comprise: placing the substrate in a high vacuum evaporation cavity, and evaporation plating a hole injection layer material on the anode 202 by applying a fine metal mask with a pattern of the hole injection layer 203, forming a pattern of the hole injection layer 203; the hole injection layer 203 partially covers the anode 202.

Wherein the hole injection layer material can preferably be copper phthalocyanine, PEDT (poly (3,4-ethylenedioxy thiophene) poly (styrene sulfonate)), PSS (sodium polystyrene sulfonate) and TNANA, etc., to ensure the holes being injected with a high efficiency.

Step S4: forming the hole transport layer 204 on the hole injection layer 203.

In particular, placing the substrate in a high vacuum evaporation cavity, and evaporation plating a hole transport layer material on the hole injection layer 203 by applying a fine metal mask with a pattern of the hole transport layer 204; the hole transport layer 204 completely covers the hole injection layer 203.

The hole transport layer material is preferably NPB (N, N'-diphenyl-N, N'-2 (1-naphthyl)-1) or diphenyl diamine derivatives, so as to ensure that the holes can be transported successfully.

Step S5: forming the electron blocking layer 205 on the hole transport layer 204 and the uncovered part of the anode 202.

This step can specifically comprise: placing the substrate in a high vacuum evaporation cavity, and evaporation plating a electron blocking layer material on the hole transport layer 204 and the uncovered part of the anode 202 by applying a fine metal mask with a pattern of the hole blocking layer 205; the vertical projection of the hole blocking layer 205 on the array substrate 201 completely overlaps with the vertical projection of the luminescent layer 206 on the array substrate 201, to ensure that the hole blocking layer 205 can blocking the electrons such that the electrons will not be transported from the luminescent layer 206 to the hole transport layer 204 and the anode 202, without blocking the transporting of the holes.

Step S6: forming a luminescent layer 206 on the electron blocking layer 205.

In particular, this step can comprise: placing the substrate in a high vacuum evaporation cavity, and evaporation plating a luminescent layer material on the electron blocking layer 205 by applying a fine metal mask with a pattern of the luminescent layer 206; the luminescent layer 206 completely covers the electron blocking layer 205.

The light emitting color of the luminescent layer 206 is same with the color of the sub pixel; preferably, the luminescent layer can be a red luminescent layer, a green luminescent layer or a blue luminescent layer; the luminescent layer 206 may comprise a fluorescent luminescent layer or a phosphorescent luminescent layer. For a red luminescent layer, the fluorescent luminescent layer material can preferably be DCJTB derivatives, star shaped DCB derivatives, polycyclic aromatic hydrocarbons, a star shaped DCB derivatives, polycyclic aromatic hydrocarbons, or a non-doping red luminescent layer material with a D-A structure, etc.; for a green luminescent layer, the fluorescent luminescent layer material can preferably be quinacridone derivatives, coumarin derivatives or polycyclic aromatic hydrocarbon, etc.; for a blue luminescent layer, the fluorescent luminescent layer material can preferably be bis-aryl derivatives, stilbene aromatic derivatives, pyrene derivatives, rotary ring spirobifluorene derivatives, TBP (N, N'-double (3-methyl phenyl)-N—N'-diphenyl diphenyl-1-1-4-4'-diamine), DSA pH and IDE-102, etc.; the phosphorescent luminescent main material can preferably be a main light emitting material with carbazole groups and property of electron transporting, etc.; the phosphorescent doped materials can preferably be platinum complexes, iridium complexes, europium complexes, osmium complexes and FIrpic, etc.

Step S7: forming the hole blocking layer 207 on the luminescent layer 206.

This step can comprise: placing the substrate in a high vacuum evaporation cavity, and evaporation plating a hole blocking layer material on the luminescent layer 206 by applying a fine metal mask with a pattern of the hole blocking layer 207; the hole blocking layer 207 partially covers the luminescent layer 206; the vertical projection of the formed hole blocking layer 207 on the array substrate 201 and the vertical projection of the hole injection 203 on the array substrate 201 do not overlap with each other.

Wherein the hole blocking layer material is preferably BCP (block copolymer) etc., so as to ensure that the hole blocking layer 207 can block the hole from the luminescent layer 206 to the electron transport layer 208, without blocking the transporting of electrons.

Step S8: forming the electron transport layer 208 on the hole blocking layer 207.

This step may comprise: placing the substrate in a high vacuum evaporation cavity, and evaporation plating an electron transport layer material on the hole blocking layer 207 by applying a fine metal mask with a pattern of the electron transport layer 208; the electron transport layer 208 completely covers the hole blocking layer 207.

Preferably, the electron transport layer material is quinoline derivatives, dinitrogen anthracene derivatives, heterocyclic compounds containing silicon, quinoxaline derivatives, phenanthroline derivatives or perfluorinated oligomer, etc., so as to ensure that the electrons can be transported successfully.

Step S9: forming the electron injection layer 209 on the electron transport layer 208.

This step may comprise: placing the substrate in a high vacuum evaporation cavity, and evaporation plating an electron injection layer material on the electron transport layer 208 by applying a fine metal mask with a pattern of the electron injection layer 209; the electron injection layer 209 completely covers the electron transport layer 208.

Preferably, the electron injection layer material is alkali metal oxides, alkali metal acetate or alkali metal fluorides, such as lithium oxide, lithium metaborate, potassium silicate, and cesium carbonate, etc., so as to ensure that the electron can be injected effectively.

Step S10: forming the cathode 2010 on the electron injection layer 209.

In particular, this step can comprise: placing the substrate in a high vacuum evaporation cavity, and evaporation plating a cathode material on the electron injection layer 209 by applying a fine metal mask with a pattern of the cathode 2010; the cathode 2010 completely covers the electron injection layer 209.

Wherein the cathode material is preferably an aluminium lithium alloy or a magnesium silver alloy.

Step S11: coating the protection layer 2011 on the light emitting device formed in step S10.

In this step, an open mask plate can be used to form the protection layer 2011; the vertical projection of the protection layer 2011 on the array substrate 201 completely overlaps with the vertical projection of the luminescent layer 206 on the array substrate 201, so as to prevent the entire light emitting device from being corroded or oxidized by the environment.

It should be noted that, the provided OLED display device and manufacturing method are illustrated with the example of the device shown in FIG. 2b. According to the structure of the display device and manufacturing method provided by the embodiment, those skilled in the art can obtain another OLED display device, of which the structure comprises: a hole transport layer located on a side of a luminescent layer facing the array substrate, and an electron transport layer located on a side of the luminescent layer departing from the array substrate; the anode and the hole transport layer completely overlap with each other, the cathode and the electron transport layer completely overlap with each other. That is, in the OLED display device, the vertical projections of the anode and the cathode on the array substrate partially cover the pixel opening area, and respectively overlap with the vertical projections of the hole transport layer and the electron transport layer on the array substrate. In such a situation, if the light emitting device is a top emitting device, a reflective layer covering each pixel opening area can be formed between the array substrate and the light emitting device, so as to reflect the light emitted downwards from the luminescent layer; the reflective layer material is preferably selected from aluminum and silver, etc., other structures can be arranged according to the type of the OLED, such that a part of the anode material and electron blocking layer material can be saved.

Figure 3:
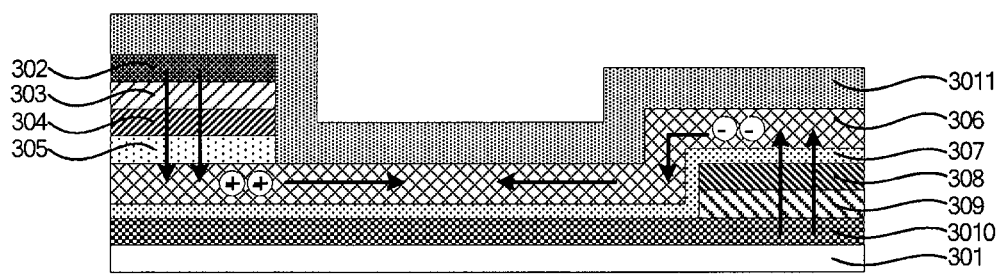
FIG. 3 is another structural diagram of a light emitting device of an OLED device provided by a second embodiment of the present invention.

In another embodiment of the present invention, the structure of the OLED display device can also be: as shown in FIG. 3, the hole transport layer 304 is located on a side of the luminescent layer 306 departing from the array substrate 301, and the electron transport layer 308 is located on an side of the luminescent layer 306 facing the array substrate 301; the anode 302 completely overlaps with the hole transport layer 304; the cathode 3010 completely overlaps with the vertical projection of the luminescent layer 306 on the array substrate 301. That is, the hole unit comprising the hole transport layer 304, hole injection layer 303 and anode 302 is located on the upper side of the luminescent layer 306; the electron unit comprising the electron transport layer 308, electron injection layer 309 and cathode 3010 is located on the lower side of the luminescent layer 306; moreover, the vertical projection of the anode 302 on the array substrate 301 partially covers the pixel opening area, the vertical projection of the cathode 3010 on the luminescent layer 306 partially covers the pixel opening area. This is equivalent to exchanging the positions of the electron unit and the hole unit in the structure shown in FIG. 2b. In such a situation, the vertical projection of the electron blocking layer 305 located between the luminescent layer 306 and the hole transport layer 304 on the luminescent layer 306 partially covers the luminescent layer 306; and the electron blocking layer 305 is completely overlapped with the hole transport layer 304; the vertical projection of the hole blocking layer 307 located between the luminescent layer 306 and the electron transport layer 308 on the array substrate 301 completely covers the vertical projection of the luminescent layer 306 on the array substrate 301; and the hole blocking layer 307 is completely overlapped with the luminescent layer 306; the protection layer 3011 completely covers the light emitting device. Since the vertical projections of the hole unit and the electron unit on the luminescent layer 306 are not overlapped with each other, the OLED display device can achieve the same beneficial effect of the device shown in FIG. 2b.

Embodiment 3

When the hole transport layer and electron transport layer are preferably located on the same side of the luminescent layer (i.e., the hole unit comprising the hole transport layer, the hole injection layer and the anode is located on the same side of the luminescent layer as the electron unit comprising the electron transport layer, the electron injection layer and the cathode), the anode can be completely overlapped with the hole transport layer, the cathode can be completely overlapped with the electron transport layer (i.e., the vertical projections of the anode and the cathode on the luminescent layer partially cover the pixel opening area, and completely overlap with the vertical projections of the hole transport layer and the electron transport layer on the luminescent layer respectively).

Figure 4:
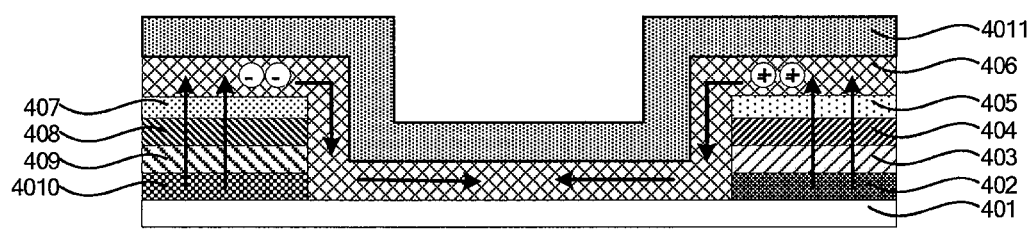
FIG. 4 is a structural diagram of a light emitting device of an OLED device provided by a third embodiment of the present invention.

As shown in FIG. 4, taking an OLED display device as an example, in which both the hole unit and electron unit are located on the lower side of the luminescent layer 406. In particular, the hole unit and electron unit are respectively located at different ends of the luminescent layer 406, and the vertical projections of them on the luminescent layer 406 partially cover the luminescent layer 406, i.e., the vertical projections do not overlap with each other; the anode 402, the hole injection layer 403, the hole transport layer 404 and the electron blocking layer 405 in the hole unit completely overlap with each other; the cathode 4010, the electron injection layer 409, the electron transport layer 408 and the hole blocking layer 407 in the electron unit completely overlap with each other; the luminescent layer 406 covers the hole unit, the electron unit and the surface of the array substrate 401 not covered by the hole unit and the electron unit; the protection layer 4011 covers the light emitting device.

For the above OLED display device, a structure and location of a reflective layer for reflecting light can be designed according to the light emitting type of the OLED display device, for example, for a top emitting display device, a reflective layer can be formed between the formation of the array substrate and the formation of the hole unit and the electron unit. Compared with the prior art, the number of the layers in the light path for the light emitted from the luminescent layer 406 of the display device is reduced, then the absorption and scattering effect for the light is reduced, reducing the loss of the light in the transmitting process, improving the external quantum efficiency of the light emitting device; thereby improving the light emitting efficiency of the OLED display device.

Figure 5:
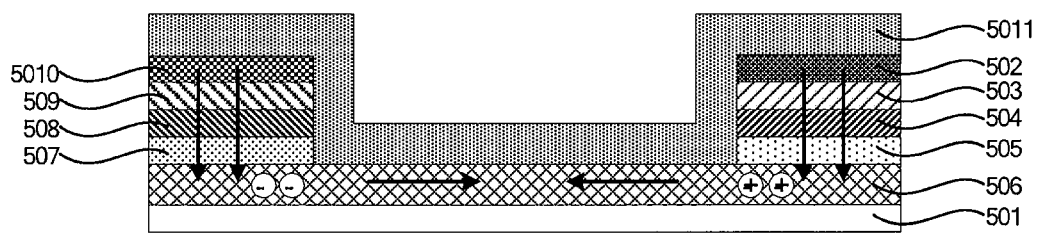
FIG. 5 is another structural diagram of a light emitting device of an OLED device provided by a third embodiment of the present invention.

As shown in FIG. 5, an embodiment also provides an OLED display device; in the OLED display device, a hole unit (comprising a hole transport layer 504, a hole injection layer 503 and an anode 502) and an electron unit (comprising an electron transport layer 508, an electron injection layer 509 and a cathode 5010) are located on the upper side of the luminescent layer 506. All the layers in the hole unit completely overlap with each other; all the layers in the electron unit completely overlap with each other. In such a situation, the luminescent layer 506 covers each pixel opening area; the electron blocking layer 505 is located between the luminescent layer 506 and the hole transport layer 504, and completely overlaps with the hole transport layer 504; the vertical projection of the electron blocking layer 505 on the luminescent layer 506 partially covers the vertical projection of the luminescent layer 506 on the array substrate 501; the hole blocking layer 507 is located between the electron transport layer 508 and the luminescent layer 506, and completely overlaps with the electron transport layer 508; the vertical projection of the hole blocking layer 507 on the array substrate 501 partially covers the vertical projection of the luminescent layer 506 on the array substrate 501; the protection layer 5011 is coated on the light emitting device. Compared with the prior art, the number of the layers in the light path for the light emitted from the luminescent layer 506 of the display device is reduced, then the absorption and scattering effect for the light is reduced, reducing the loss of the light in the transmitting process, improving the external quantum efficiency of the light emitting device; thereby improving the light emitting efficiency of the OLED display device.

Apparently, the person skilled in the art may make various alterations and variations to the invention without departing the spirit and scope of the invention. As such, provided that these modifications and variations of the invention pertain to the scope of the claims of the invention and their equivalents, the invention is intended to embrace these alterations and variations.

The invention claimed is:

1. An organic light emitting device comprising:
a substrate;
a hole transport layer, an organic luminescent layer and an electron transport layer arranged on the substrate; and
an electron blocking layer located between the hole transport layer and the organic luminescent layer, and a hole blocking layer located between the electron transport layer and the organic luminescent layer;
wherein the hole transport layer and the electron transport layer are located on different sides of the organic luminescent layer respectively, or the hole transport layer and the electron transport layer are located on the same side of the organic luminescent layer;
wherein areas of the hole transport layer, the organic luminescent layer and the electron transport layer are arranged so that both an orthographic projection of the hole transport layer on the substrate and an orthographic projection of the electron transport layer on the substrate partially cover an orthographic projection of the organic luminescent layer on the substrate; and
wherein the orthographic projection of the hole transport layer on the substrate and the orthographic projection of the electron transport layer on the substrate do not overlap with each other.

2. The organic light emitting device according to claim 1, further comprising: a hole injection layer located on a side of the hole transport layer departing from the organic luminescent layer, and an electron injection layer located on a side of the electron transport layer departing from the organic luminescent layer; wherein the hole injection layer completely overlaps with the hole transport layer; the electron injection layer completely overlaps with the electron transport layer.

3. The organic light emitting device according to claim 2, further comprising: an anode located on a side of the hole injection layer departing from the organic luminescent layer, and a cathode located on a side of the electron injection layer departing from the organic luminescent layer.

4. The organic light emitting device according to claim 3, wherein the hole transport layer and the electron transport layer are located on the same side of the organic luminescent layer, the anode completely overlaps with the hole transport layer; the cathode completely overlaps with the electron transport layer.

5. The organic light emitting device according to claim 3, wherein the hole transport layer is located on a side of the organic luminescent layer facing the substrate, and the electron transport layer is located on a side of the organic luminescent layer departing from the substrate, the anode completely overlaps with the organic luminescent layer or the hole injection layer, the cathode completely overlaps with the electron injection layer.

6. The organic light emitting device according to claim 3, wherein the hole transport layer is located on a side of the organic luminescent layer departing from the substrate, and the electron transport layer is located on a side of the organic luminescent layer facing the substrate, the anode completely overlaps with the hole injection layer, the cathode completely overlaps with the electron injection layer or the organic luminescent layer.

7. The organic light emitting device according to claim 1, further comprising: a protection layer arranged on a side of the organic light emitting device departing from the substrate.

8. An organic light emitting device comprising:
a substrate;
a hole transport layer, an organic luminescent layer and an electron transport layer arranged on the substrate;
a hole injection layer located on a side of the hole transport layer departing from the organic luminescent layer, and an electron injection layer located on a side of the electron transport layer departing from the organic luminescent layer; wherein the hole injection layer completely overlaps with the hole transport layer; the electron injection layer completely overlaps with the electron transport layer; and
an anode located on a side of the hole injection layer departing from the organic luminescent layer, and a cathode located on a side of the electron injection layer departing from the organic luminescent layer;
wherein areas of the hole transport layer, the organic luminescent layer and the electron transport layer are arranged so that both an orthographic projection of the hole transport layer on the substrate and an orthographic projection of the electron transport layer on the substrate partially cover an orthographic projection of the organic luminescent layer on the substrate;
wherein the orthographic projection of the hole transport layer on the substrate and the orthographic projection of the electron transport layer on the substrate do not overlap with each other; and
wherein the hole transport layer and the electron transport layer are located on the same side of the organic luminescent layer, the anode completely overlaps with the hole transport layer; the cathode completely overlaps with the electron transport layer.

* * * * *